(12) United States Patent
Wicks

(10) Patent No.: US 8,018,019 B2
(45) Date of Patent: Sep. 13, 2011

(54) SPACE-CHARGE-FREE SEMICONDUCTOR AND METHOD

(75) Inventor: Gary Wicks, Fairport, NY (US)

(73) Assignee: University of Rochester, Rochester, NY (US)

( * ) Notice: Subject to any disclaimer, the term of this patent is extended or adjusted under 35 U.S.C. 154(b) by 485 days.

(21) Appl. No.: 12/117,221

(22) Filed: May 8, 2008

(65) Prior Publication Data

US 2009/0065803 A1   Mar. 12, 2009

Related U.S. Application Data

(60) Provisional application No. 60/916,678, filed on May 8, 2007.

(51) Int. Cl.
*H01L 21/00*   (2006.01)

(52) U.S. Cl. ........ 257/470; 438/199; 438/356; 438/604; 257/544

(58) Field of Classification Search ............. 438/199, 438/356, 604; 257/470, 544
See application file for complete search history.

(56) References Cited

U.S. PATENT DOCUMENTS

| | | | |
|---|---|---|---|
| 5,097,298 A * | 3/1992 | Ehara | 257/94 |
| 7,655,961 B2 * | 2/2010 | Marrocco et al. | 257/184 |
| 7,795,640 B2 * | 9/2010 | Klipstein | 257/188 |

OTHER PUBLICATIONS

S. Maimon et al.; nBn detector, an infrared detector with reduced dark current and higher operating temperature; Applied Physics Letters 89, 151109 (2006) American Institute of Physics.

* cited by examiner

*Primary Examiner* — Jarrett J Stark
*Assistant Examiner* — Nicholas Tobergte
(74) *Attorney, Agent, or Firm* — William Greener; Bond, Schoeneck & King, PLLC

(57) ABSTRACT

A semiconductor having a an n-type material and a p-type material, wherein the n-type material and p-type material are joined to form a space-charge-free p-n junction. The energy of the Fermi-level of the n-type material is equal to the energy of the Fermi-level of the p-type material. This allows for the pre-alignment of the Fermi-levels of the n-type and the p-type materials. The semiconductor has minimal or no g-r noise. The semiconductor can be operated at $T_{BLIP}$ in the range of about 220° to about 240° K.

12 Claims, 5 Drawing Sheets

SPACE-CHARGE-FREE SEMICONDUCTOR AND METHOD

REFERENCE TO RELATED APPLICATIONS

This application claims priority to U.S. Provisional Application No. 60/916,678, filed May 8, 2007, the subject matter of which is hereby incorporated by reference in its entirety.

This invention was made with government support under UR Award Number 048783-003 from the Office of Naval Research. The government may have certain rights in the invention.

FIELD OF THE INVENTION

The present invention relates generally to semiconductors, and more particularly to p-n junctions having improved signal-to-noise ratio. Even more particularly, the invention is directed to space-charge-free p-n junctions in semiconductor devices, materials and methods associated therewith, and applications thereof.

BACKGROUND

Semiconductors that detect light or other electromagnetic energy are called photo-detectors. There are several varieties including, but not limited to, optical detectors, chemical detectors, photoresistors, photovoltaic cells, photodiodes, and phototubes. Photo-detectors are used in a variety of applications including imaging. A specific type of photo-detector sensitive to the infra-red (IR) wavelengths of light is also known as an IR detector.

IR detectors are used in a variety of applications, and in particular in the military field where they are used as thermal detectors in night vision equipment, air borne systems, naval systems and missile systems.

The p-n junction is the foundation of semiconductors. It has been used as the basic building block for a wide variety of electronic and optoelectronic devices, such as diodes, transistors, optical detectors, and semiconductor lasers. It has been thought that a fundamental characteristic of the p-n junction is that it requires a depletion region, also known as a space charge region. The space charge region of conventional mid-IR detectors is a dominant source of defect-produced noise, also known as Shockley-Read-Hall (SRH) noise or generation-recombination (g-r) noise. This noise is produced by the creation of current carriers via thermal excitation through mid-gap defects in depletion regions. Fluctuations in g-r current are often the dominant source of noise in infrared photodiodes. G-r noise determines the amount of cooling required to reach background-limited-infrared-photodetection (BLIP) conditions in certain photodetectors. G-r noise can be reduced to minimal levels by cooling, but cooling is inconvenient and expensive, adds weight and bulk to the detector, and reduces the detector lifetime. If g-r noise could be eliminated, BLIP temperatures ($T_{BLIP}$) of various photodetectors could be increased. An example of a $T_{BLIP}$ for a conventional photodetector is in the range of about 100° K. to about 120° K.

It is a primary object of the invention to provide a space-charge-free p-n junction in semiconductors. It is another object of the invention to provide p-n junctions having minimal or no g-r noise. It is a further object of the invention to provide p-n junctions that can function with increased $T_{BLIP}$.

SUMMARY OF THE INVENTION

These and other objects and advantages are accomplished by a semiconductor having a an n-type material and a p-type material, wherein the n-type material and p-type material are joined to form a space-charge-free p-n junction. In one embodiment of the invention, prior to the joining of the n-type material and p-type material at a p-n junction, the Fermi-levels are pre-aligned. In one aspect of this embodiment, the energy of the Fermi-level of the n-type material is equal to the energy of the Fermi-level of the p-type material. This allows for the pre-alignment of the Fermi-levels of the n-type and the p-type materials. The semiconductor has minimal or no g-r noise. The semiconductor can be operated at $T_{BLIP}$ in the range of about 220° K. to about 240° K.

In another embodiment of the invention, a method of making a semiconductor having a space-charge-free p-n junction is provided. In one aspect of the method, an n-type material is selected. The Fermi energy of the n-type material is known. A p-type material is then selected such that the Fermi energy of the p-type material can be adjusted or "tuned" to equal the Fermi energy of the n-type material.

In yet another embodiment of the invention, a semiconductor having a p-i-n junction is provided. In one aspect of this embodiment, an intrinsic material is inserted between the n-type and p-type materials to prevent or suppress leakage current. The energy level of the valance band of the intrinsic material is not lower than the energy level of the valence band of the n-type material.

In a further embodiment of the invention, a semiconductor having a space-charge-free p-n junction is provided wherein the Fermi levels of the p-type and n-type materials are not initially aligned. The initial misalignment of the Fermi levels can be compensated by the application of a voltage, thereby producing a space-charge-free condition under an applied voltage.

DETAILED DESCRIPTION

An embodiment of the present invention provides a p-n junction having no space charge region or depletion layer. This space-charge-free p-n junction is useful in a variety of semiconductor devices.

Figure 1:
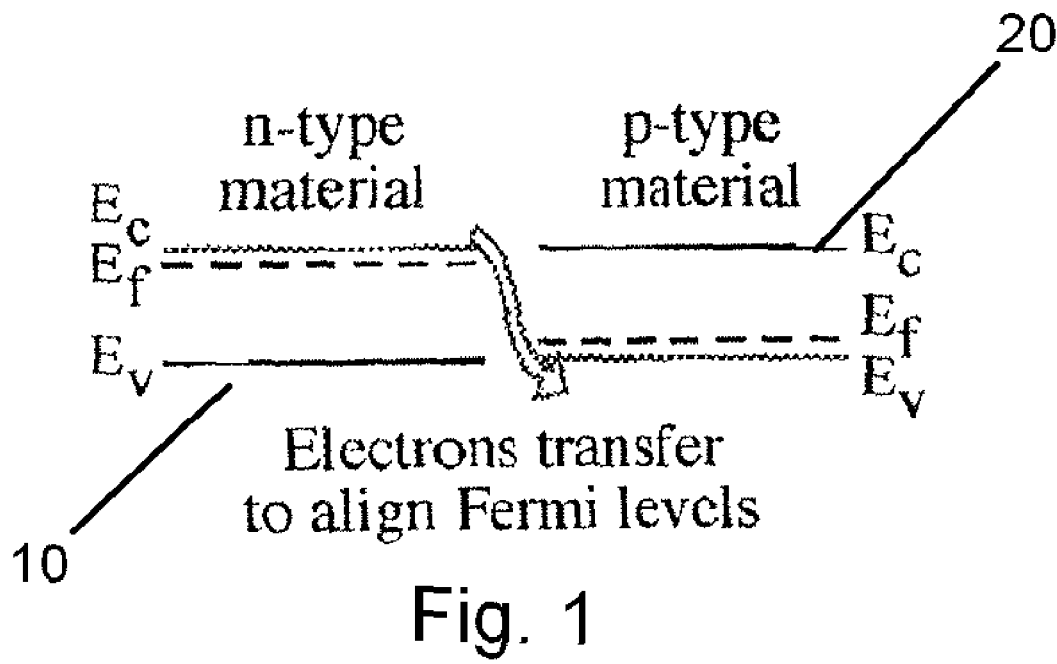
FIG. 1 is an energy band profile of a conventional p-n junction prior to the n-type and p-type materials being joined.
Figure 2:
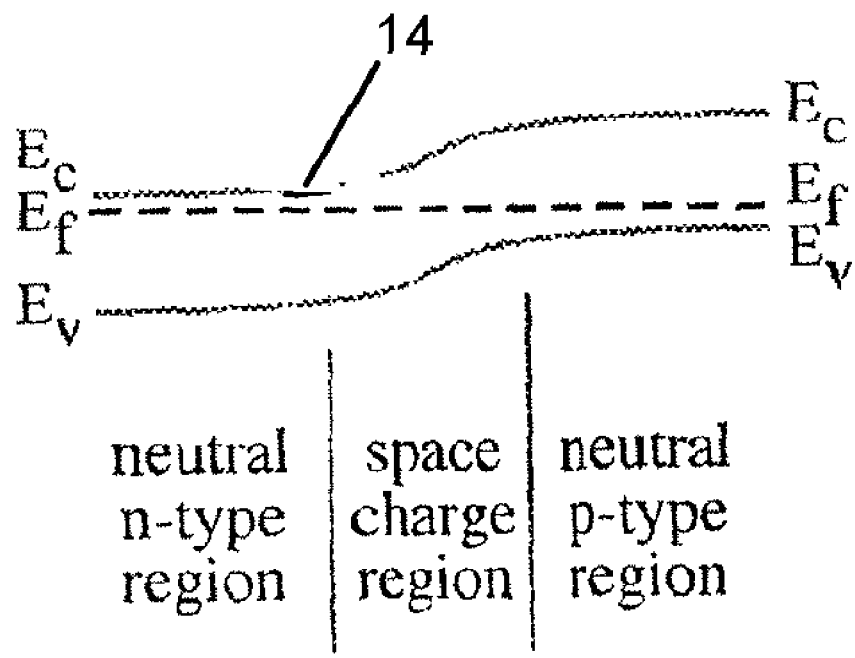
FIG. 2 is an energy band profile of a conventional p-n junction after the n-type and p-type materials have been joined.

Reference is made to FIG. 1, which shows the transfer of electrons that occurs in conventional or prior art p-n junctions. An n-type material 10 is shown positioned next to a p-type material 12. Each material is shown with its conduction band $E_c$, valence band $E_v$, and Fermi level $E_f$. In order to equalize the Fermi levels at the p-n junction, a transfer of elections is necessary. The arrows show movement of the electrons from the n-type material 10 to the p-type material 12. FIG. 2 illustrates the joined n-type and p-type materials, wherein a space charge region 14 is created by the movement of electrons. Band-bending of the conduction and valence bands also occurs in order to align the Fermi levels of the two materials. The space charge region 14 created by the shift of electrons has been known to create noise, thereby degrading the device performance.

Figure 3:
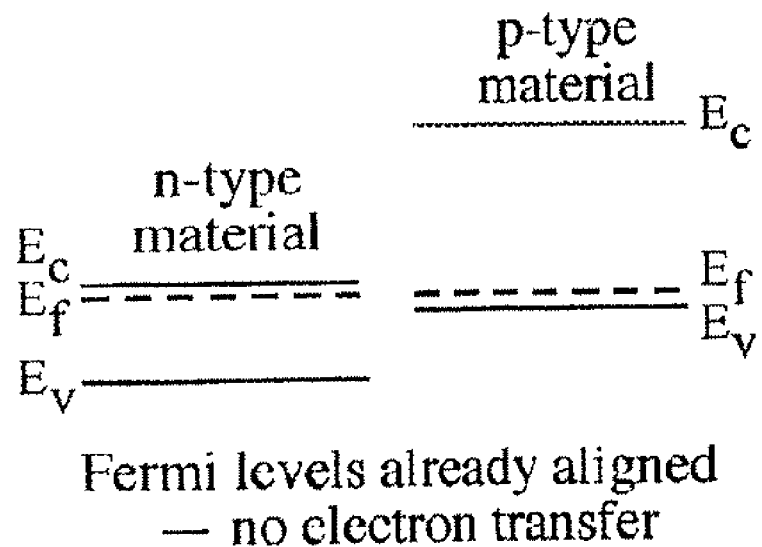
FIG. 3 is an energy band profile of a space-charge-free p-n junction prior to the n-type and p-type materials being joined, according to an exemplary embodiment of the invention.
Figure 4:
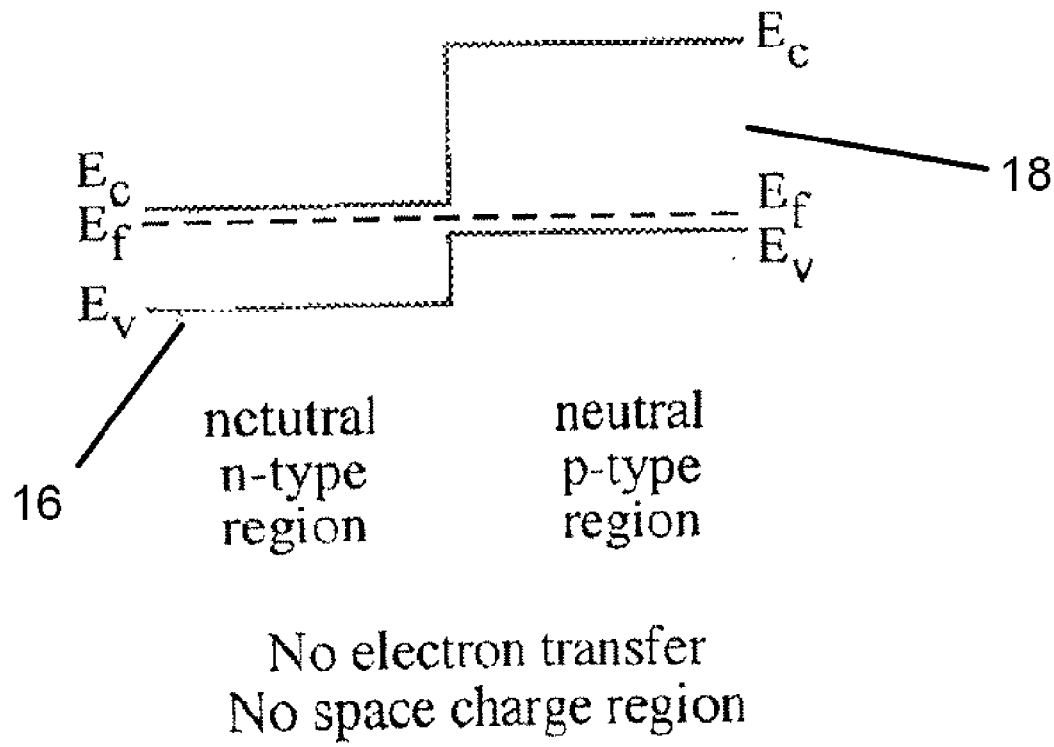
FIG. 4 is an energy band profile of a space-charge-free p-n junction after the n-type and p-type materials have been joined, according to an exemplary embodiment of the invention.

FIG. 3 illustrates the materials used to fabricate the p-n junction according to an exemplary embodiment of the invention. The Fermi level of the n-type material is equal to the Fermi level of the p-type material. Since the Fermi levels of the materials are equal and aligned prior to actual joining of the materials, the creation of the space-charge region is prevented. FIG. 4 illustrates the p-n junction of the joined materials with the absence of a space-charge region. The Fermi level is consistent from the n-type region to the p-type region. The energy levels of the valence band edge and conduction band edge of the n-type region 16 are lower than the energy levels of the valence band edge and conduction band edge of the p-type region 18. Furthermore, there is no bending of the valence and conduction bands, since the Fermi levels are pre-aligned.

Figure 5:
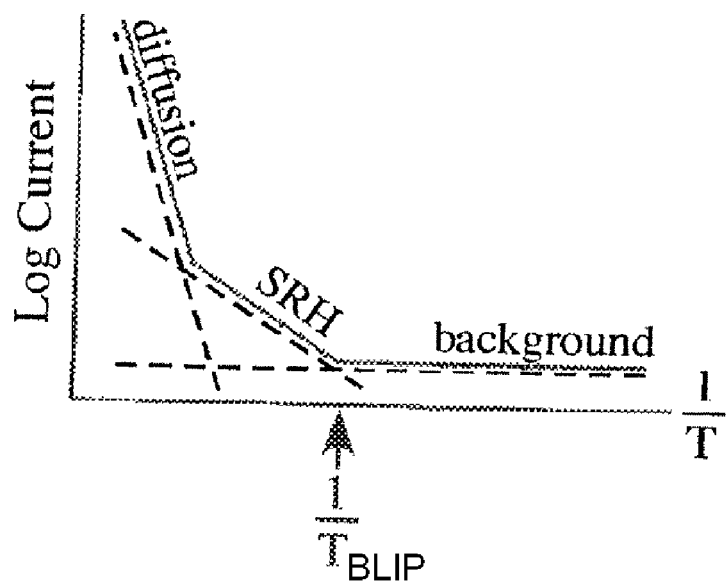
FIG. 5 is a graphical representation of dominant noise sources of conventional photodiodes with respect to reciprocal temperature.
Figure 6:
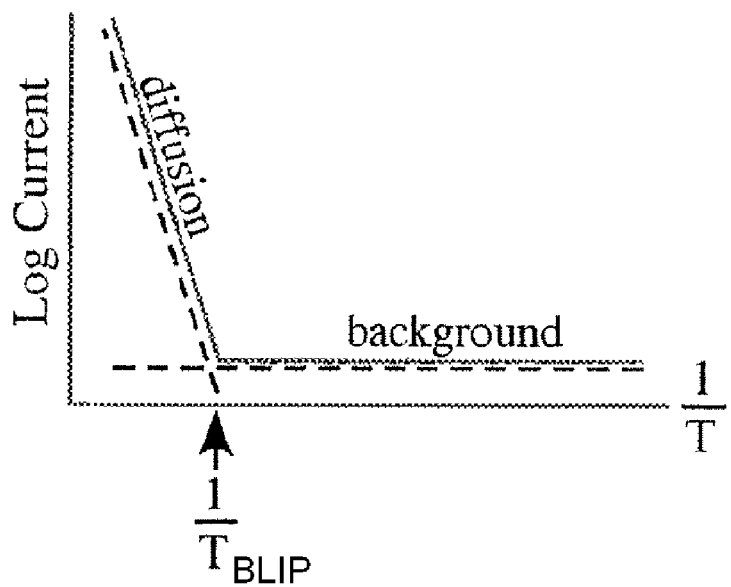
FIG. 6 is a graphical representation of dominant noise sources of space-charge-free photodiodes with respect to reciprocal temperature, according to an embodiment of the invention.
Figure 7:
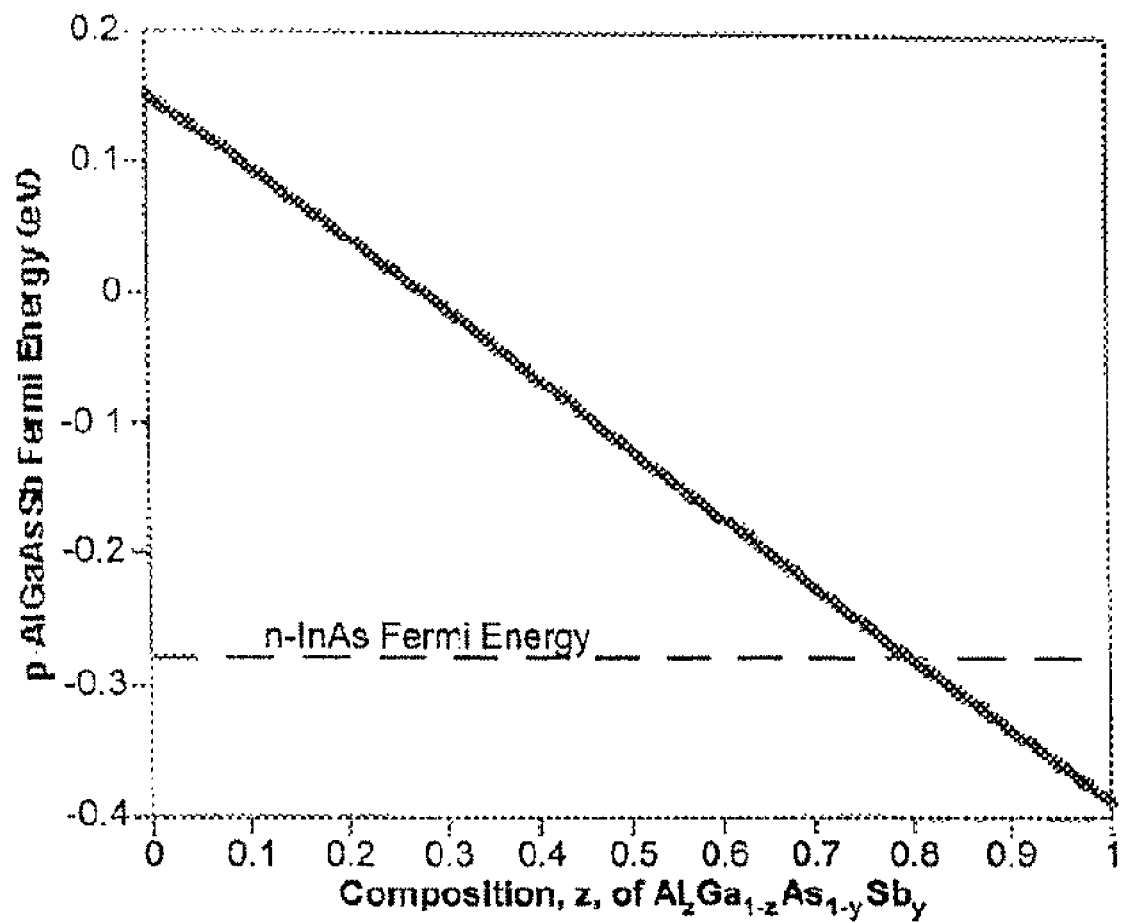
FIG. 7 is a graphical representation of the Fermi energy of AlGaAsSb.

FIGS. 5 and 6 show dominant noise sources with respect to reciprocal temperature. FIG. 5 shows temperature dependence of detector noise of a prior art photodiode. As shown in the graph, SRH or g-r noise is present from the existence of a depletion region.

FIG. 6 illustrates temperature dependence of detector noise of a apace-charge-free photodiode according to an exemplary embodiment of the invention. The noise produced in the photodiode of FIG. 6 increases the $T_{BLIP}$ in comparison to the prior art photodiode, which has a lower $T_{BLIP}$.

In another aspect of the invention, a method of fabricating the space-charge-free p-n junction is provided. The first step is to select the starting material for either the n-type material or the p-type material. The next step is to determine and select the second material based on the first material selected. The following non-limiting example illustrates an exemplary embodiment of the invention. In this example, the n-type material is selected first. Examples of n-type materials include, but are not limited to, InAs, InSb and HgCdTe. In this example, InAs is chosen to make a mid-wave infrared (MWIR) detector. Next, a candidate for the p-type material is determined. In this case, alloy semiconductors are considered so that the Fermi energy can be modified or "tuned" by varying the composition. It may be advantageous that the lattice of the p-type material matches the lattice of the n-type material in order to maintain the crystal structure of the material. A quaternary compound is chosen so that the composition can be varied to simultaneously tune the Fermi energy while maintaining a lattice-match to the InAs. It was found that the compound, $Al_zGa_{1-z}As_{1-y}Sb_y$, was a suitable match for InAs. FIG. 5 illustrates the Fermi level of the p-material, $Al_zGa_{1-z}As_{1-y}Sb_y$, with respect to varying the composition of the material. As shown in the graph, the composition consisting of $Al_{0.79}Ga_{0.21}As_{0.14}Sb_{0.86}$ has a Fermi level equal to the Fermi level of InAs. The value of z can range from about 0.7 to about 0.9 and the value of y can range from about 0.85 to about 0.87.

Figure 8:
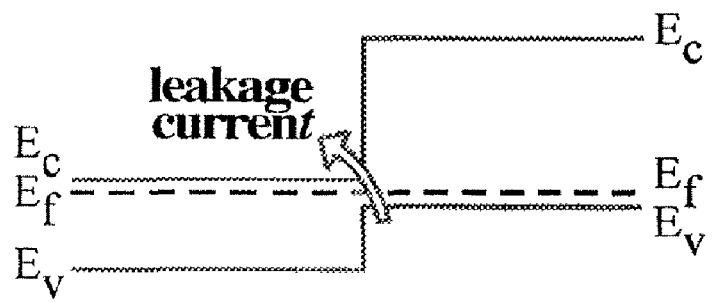
FIG. 8 is an energy band profile of a space-charge-free p-n junction exhibiting leakage current.
Figure 9:
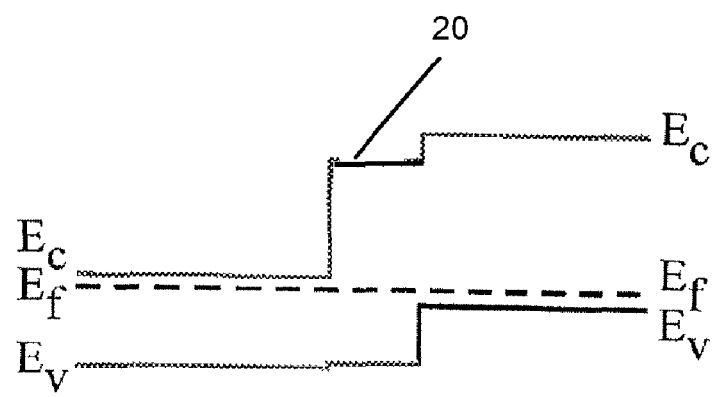
FIG. 9 is an energy band profile of a space-charge-free p-i-n junction limiting leakage current, according to an exemplary embodiment of the invention.

Electron leakage may occur because the top of the valence band on the p-side is immediately adjacent to the bottom of the conduction band on the n-side. In an effort to suppress leakage current that may occur at the p-n junction, it was found that the insertion of an intrinsic layer at the p-n junction to provide a p-i-n junction proved beneficial. FIG. 8 illustrates leakage current at the p-n junction. FIG. 9 illustrates a p-i-n junction with an intrinsic layer 20. Intrinsic layer 20 is selected so that there is near-zero valence band offset with respect to the n-type region. The intrinsic layer 20 separates the top of the valence band on the p-side from the bottom of the conduction band on the n-side. The intrinsic layer is chosen with band edge alignments that do not impede the movement of the minority carriers from the active side across the junction. The requirements of the undoped intrinsic layer will vary with device applications. For example, for a photodiode that is designed so that the light-absorbing layer is the n-side, the intrinsic layer will be designed with band alignments to allow the n-side minority carriers (holes on the n-side) to flow across the device. If the photodiode is designed so that the light-absorbing layer is the p-side, then the intrinsic layer will be designed to allow p-side minority carriers (electrons on the p-side) to flow across the device.

In many applications of p-n junctions, such as in photodiodes, a second deleterious effect in conventional p-n junctions is leakage current along the surfaces. Surface leakage currents are more severe problems in semiconductors with low energy bandgaps. The space-charge-free p-i-n junction uses both low bandgap and high bandgap semiconductor materials. The presence of the high bandgap semiconductor will significantly reduce the surface leakage, compared to conventional p-n junctions. Accordingly, the space-charge-free p-i-n junction combines the benefits of small bandgap semiconductors (detection of long wavelength light) with the benefits of large bandgap semiconductors (reduction of surface leakage current).

In yet another embodiment of the invention, a space-charge-free p-n junction is provided wherein the Fermi levels of the p-type and n-type materials are not initially aligned. The initial misalignment of the Fermi levels can be compensated by the application of a voltage, thereby producing a space-charge-free condition under an applied voltage. For example, if, before joining of the p-type and n-type materials, the Fermi level of the p-type material is higher than that of the n-type material by an amount, $E_{f,p} - E_{f,n}$, then application of a reverse voltage equal to $$\frac{E_{f,p} - E_{f,n}}{e}$$

would create the space-charge-free condition, wherein
$F_{f,p}$ is the Fermi level of the p-type material;
$E_{f,n}$ is the Fermi level of the n-type material; and
e is the charge on an electron.

The p-n and p-i-n junction embodiments of the present invention are useful in a variety of devices including, but not limited to, short-wave, mid-wave, long-wave, very long-wave detectors, type II (strained) superlattice infrared detectors, photovoltaic devices, and thermal imagers (aka infrared cameras). Applications may advantageously include, but are not limited to, devices for the Department of Defense and the Department of Homeland Security. The devices using the p-n and p-i-n junctions herein will be lighter, less expensive, and longer lasting than provided by current technology.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended embodiments.

I claim:

1. A semiconductor comprising:
    an n-type material having a characteristic Fermi level;
    a p-type material having a characteristic Fermi level; and
    an intrinsic material disposed between the n-type material and the p-type material,
    wherein the n-type material, the intrinsic material, and the p-type material are joined together at a p-i-n junction;
    further wherein the characteristic Fermi-level of the n-type material is equal to the characteristic Fermi-level of the p-type material prior to joining the n-type and p-type materials.

2. The semiconductor of claim 1, wherein the energy levels of the valence band and the conduction band in the n-type material is lower than the energy levels of the valance band and the conduction band in the p-type material.

3. The semiconductor of claim 1, wherein the semiconductor is a photodetector having a $T_{BLIP}$ operating range that is equal to or greater than about 220° K.

4. The semiconductor of claim 1, wherein the n-type material comprises InAs, InSb or HgCdTe.

5. The semiconductor of claim 1, wherein the n-type material comprises InAs and the p-type material comprises $Al_{0.79}Ga_{0.21}As_{0.14}Sb_{0.86}$.

6. The semiconductor of claim 1 wherein the energy level of the intrinsic material valence band is not lower than the energy level of the n-type material valance band.

7. A short-wave detector, mid-wave detector, long-wave detector, very long-wave detector, type II (strained) superlattice infrared detector, or photovoltaic device comprising the semiconductor of claim 1.

8. A thermal imager comprising:
    a semiconductor, wherein the semiconductor comprises an n-type material having a characteristic Fermi level and a p-type material having a characteristic Fermi level, wherein the n-type material and p-type material are joined together at a p-i-n junction and wherein the Fermi-level of the n-type material is equal to the Fermi-level of the p-type material prior to joining the n-type and p-type materials.

9. A method of making a semiconductor comprising:
    selecting an n-type material having a first characteristic Fermi level;
    selecting a p-type material having a second characteristic Fermi level, wherein the second characteristic Fermi level is equal to the first characteristic Fermi level;
    providing an intrinsic layer between the n-type material and the p-type material; and
    joining the n-type material to the p-type material to create a space-charge-free p-i-n junction.

10. The method of claim 9, wherein the n-type material comprises InAs, InSb or HgCdTe.

11. The method of claim 10, wherein the p-type material comprises $Al_zGa_{1-z}As_{1-y}Sb_y$, wherein z is about 0.7 to about 0.9 and y is about 0.85 to about 0.87.

12. A method of making a semiconductor, comprising:
    selecting a p-type material having a first characteristic Fermi level;
    selecting an n-type material having a second characteristic Fermi level,
    wherein the second Fermi level is equal to the first Fermi level prior to joining the p-and n-type materials; and
    joining the p-type material and the n-type materials to create a space-charge-free p-i-n junction.

* * * * *